United States Patent
Shaheen et al.

(10) Patent No.: US 7,355,247 B2
(45) Date of Patent: Apr. 8, 2008

(54) SILICON ON DIAMOND-LIKE CARBON DEVICES

(75) Inventors: Mohamad A. Shaheen, Portland, OR (US); Kramadhati V. Ravi, Atherton, CA (US)

(73) Assignee: Intel Corporation, Santa Clara, CA (US)

( * ) Notice: Subject to any disclaimer, the term of this patent is extended or adjusted under 35 U.S.C. 154(b) by 63 days.

(21) Appl. No.: 11/072,347

(22) Filed: Mar. 3, 2005

(65) Prior Publication Data

US 2006/0220028 A1  Oct. 5, 2006

(51) Int. Cl.
*H01L 27/01* (2006.01)
*H01L 27/12* (2006.01)
*H01L 31/0392* (2006.01)

(52) U.S. Cl. ............ 257/347; 257/348; 257/349; 257/350; 257/351; 257/352; 257/353; 257/354

(58) Field of Classification Search ......... 257/347–354
See application file for complete search history.

(56) References Cited

U.S. PATENT DOCUMENTS

| | | | |
|---|---|---|---|
| 5,728,624 A * | 3/1998 | Linn et al. | 438/459 |
| 6,271,594 B1 * | 8/2001 | Matsubara | 257/760 |
| 6,316,329 B1 * | 11/2001 | Hirota et al. | 438/424 |
| 6,337,518 B1 * | 1/2002 | Grill et al. | 257/758 |
| 6,346,747 B1 * | 2/2002 | Grill et al. | 257/752 |
| 6,570,223 B1 * | 5/2003 | Machida et al. | 257/347 |
| 6,620,698 B1 * | 9/2003 | Chen et al. | 438/311 |
| 6,627,531 B2 * | 9/2003 | Enquist | 438/622 |
| 6,770,955 B1 | 8/2004 | Chrysler et al. | |
| 6,890,810 B2 * | 5/2005 | Amadon et al. | 438/210 |
| 2003/0201492 A1 | 10/2003 | Ravi | |
| 2004/0256624 A1 * | 12/2004 | Sung | 257/77 |

OTHER PUBLICATIONS

Patent Application 042390.P12086, U.S. Appl. No. 10/208,890.
Patent Application 042390.14435, U.S. Appl. No. 10/227,068.
Patent Application 042390.16009, U.S. Appl. No. 10/608,406.
Patent Application 042390.16684, U.S. Appl. No. 10/672,968.

(Continued)

*Primary Examiner*—Ida M. Soward
(74) *Attorney, Agent, or Firm*—Kathy Ortiz; Intel Corporation (57) ABSTRACT

Embodiments of the invention provide substrate with an insulator layer on the substrate. The insulator layer may include diamond-like carbon. A device, such a tri-gate transistor may be formed on the diamond-like carbon layer.

18 Claims, 10 Drawing Sheets

OTHER PUBLICATIONS

Patent Application 042390.P20396, U.S. Appl. No. 10/987,775.
Patent Application 042390.P15039, U.S. Appl. No. 10/314,015.
Patent Application 042390.P15039D, U.S. Appl. No. 10/824,458.
Patent Application 042390.P15482, U.S. Appl. No. 10/313,686.
Patent Application 042390.P15482D, U.S. Appl. No. 10/973,161.
Patent Application 042390.P16932, U.S. Appl. No. 10/610,356.
Patent Application 042390.P17616, U.S. Appl. No. 10/835,479.
Patent Application 042390.P19032, U.S. Appl. No. 10/809,243.

"Replacing the BOX with buried alumina: Improved thermal dissipation in SOIMOSFET's" K. Oshima, et al. Proceedings of the International Symposium on Silicon on Insulator Technology and Devices XI, The Electrochemical Society, p. 45(2003).

"Studies on novel SOI structures with AlN film as buried insulator" C. Lin et al. Proceedings of the International Symposium on Silicon on Insulator Technology and Devices XI, The Electrochemical Society, p. 51 (2003).

* cited by examiner

SILICON ON DIAMOND-LIKE CARBON DEVICES

BACKGROUND OF THE INVENTION

In order to increase device performance, silicon on insulator (SOI) devices have been proposed for the fabrication of modern integrated circuits. A SOI transistor may include a substrate with a lower single crystalline silicon layer and an insulating layer, such as a buried oxide, formed thereon. A single crystalline silicon film may be formed on the insulating layer, with the resulting SOI substrate thus including a silicon layer on a buried insulator layer. A transistor may then be formed. The insulator material in the SOI substrate may reduce the capacitance of the substrate and allow the transistor to operate faster.

BRIEF DESCRIPTION OF THE DRAWINGS

FIGS. 3a through 3f are cross sectional side views that illustrate some various stages in the fabrication described in FIG. 2.

FIGS. 5a through 5d are cross sectional side views that illustrate some various stages in the fabrication described in FIG. 4.

DETAILED DESCRIPTION

In various embodiments, an apparatus and method relating to the formation of a substrate are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1A:
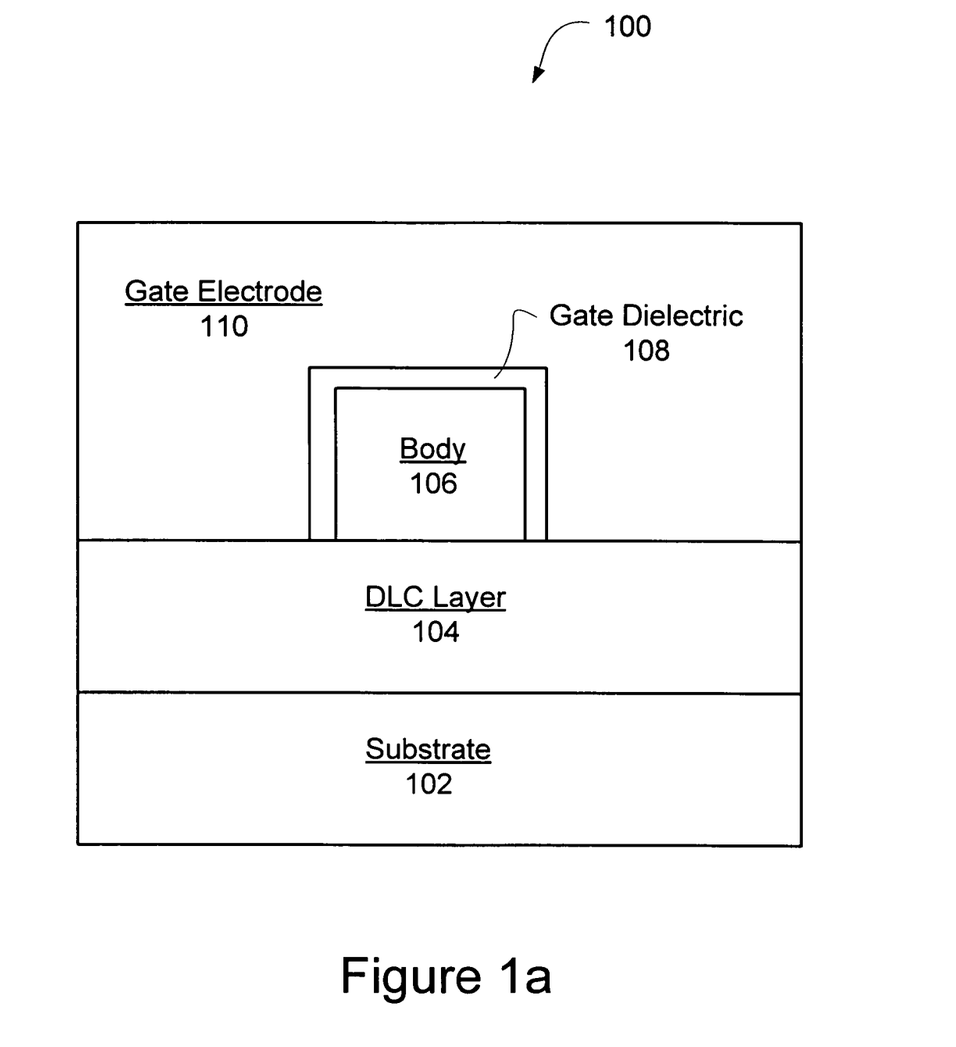
FIG. 1a is a cross sectional side view that illustrates a generalized transistor formed on an insulator layer according to one embodiment of the present invention.
Figure 1B:
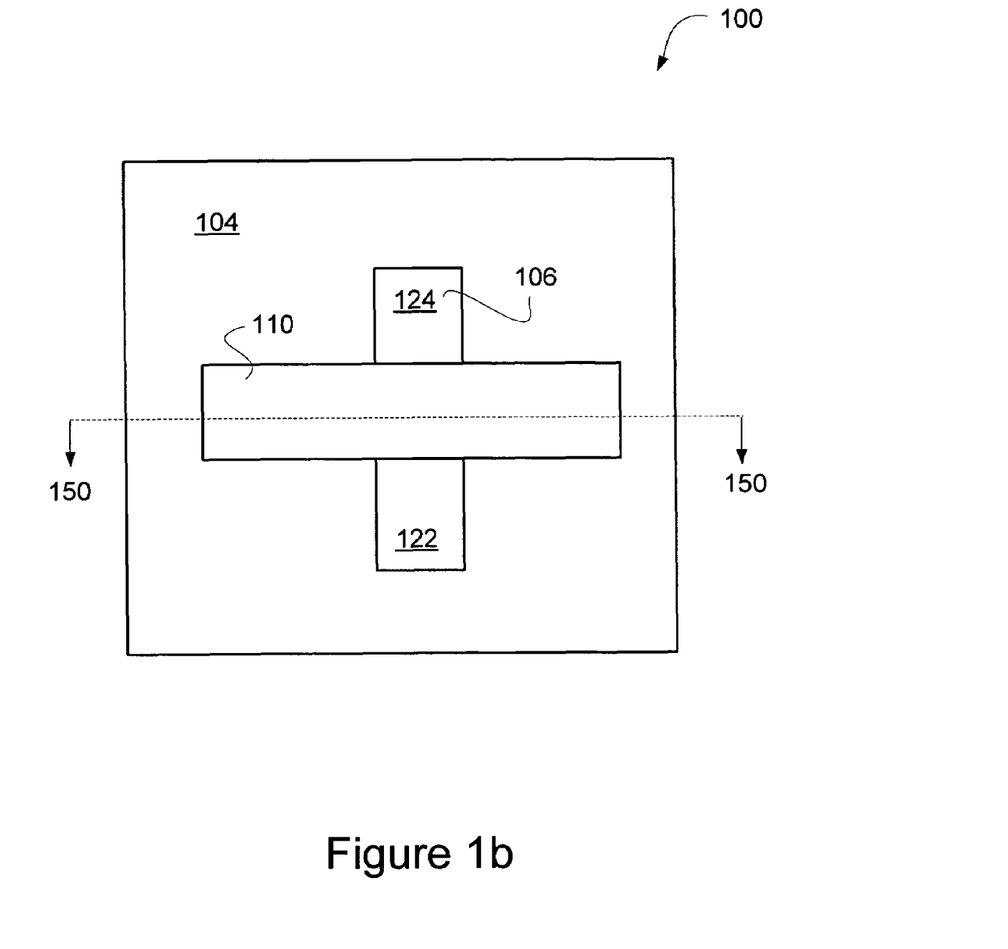
FIG. 1b is a top view that illustrates the transistor from above.

FIG. 1a is a cross sectional side view that illustrates a generalized transistor 100 formed on an insulator layer 104 according to one embodiment of the present invention. FIG. 1b is a top view that illustrates the transistor 100 from above, with the line 150-150 of FIG. 1b showing the location of the cross section illustrated in FIG. 1a. While a transistor 100 is illustrated and described, other types of devices may be formed on the insulator layer 104 in addition to, or in place of, the transistor 100. In some embodiments, the substrate on which the transistor 100 is formed is a silicon on insulator (SOI) substrate where the insulating layer may be resistant to commonly used etching or other processing operations and/or may be a good conductor of heat. For example, in an embodiment the insulator layer 104 may have a thermal conductivity of about 0.5 W/cmK to about 1.0 W/cmK, and in another embodiment the insulator layer 104 may have a thermal conductivity of about 50 to 70 times that of silicon dioxide.

In some embodiments, the insulating layer of the SOI substrate may comprise a diamond-like carbon (DLC) material, such as a DLC film. A DLC film may be a hard at least partially amorphous film with a significant fraction of $sp^3$-hybridized carbon atoms and which may contain hydrogen or be substantially pure carbon. Depending on the way in which the film is formed, the DLC film may be fully amorphous or contain diamond crystallite regions. Thus, a DLC film is a hard, at least partially amorphous carbon film.

As shown in FIG. 1a, an embodiment of the transistor 100 may include a substrate 102. In an embodiment, the substrate 102 may be single crystal silicon. In another embodiment, the substrate 102 may be another semiconductor such as gallium arsenide, polycrystalline silicon, or another material. In yet other embodiments, the substrate 102 may comprise one or more other materials.

There may be an insulator layer 104 on the substrate 102. In an embodiment, the insulator layer 104 may be a DLC layer 104, although in other embodiments the insulator layer 104 may comprise another material. This material may be etch resistant and/or transmit heat well. In an embodiment, the insulator layer 104 comprises DLC, although other materials may be used.

The transistor 100 may be a tri-gate transistor 100, although it may also be other types of transistors. The tri-gate transistor 100 may include a semiconductor body 106 formed on a DLC layer 104 on the substrate 102. Semiconductor body 106 may be formed of any well-known semiconductor material, such as but not limited to silicon (Si), germanium (Ge), silicon germanium ($Si_xGe_y$), gallium arsenide (GaAs), InSb, GaP, GaSb and carbon nanotubes. Semiconductor body 106 may be formed of any well-known material which can be reversibly altered from an insulating state to a conductive state by applying external electrical controls. Semiconductor body 106 may be a single crystalline film. Semiconductor body 106 may also be a polycrystalline film or another material. The DLC layer 104 may insulate the semiconductor body 106 from the substrate 102.

The semiconductor body 106 may have a pair of laterally opposite sidewalls that extend away from the DLC layer 104. These sidewalls may be separated by a distance which defines a semiconductor body 106 width. Additionally, semiconductor body 106 may have a bottom surface that may be formed on the DLC layer 104, and a top surface opposite the bottom surface. The distance between the top surface and the bottom surface may define a body height. In an embodiment of the present invention the body height may be substantially equal to the body width. In an embodiment of the present invention, the body 106 may have a width and height less than 30 nanometers, in another less than 20 nanometers, and in another embodiment about 10 nanometers or less. In an embodiment of the present invention, the body height may be between ½ the body width to 2 times the body width.

Tri-gate transistor 100 may have a gate dielectric layer 108. Gate dielectric layer 108 may be formed on and around three sides of semiconductor body 106 as shown in FIG. 1. Gate dielectric layer 108 may be formed on or adjacent to the sidewalls and on the top surface of the body 106 as shown in FIG. 1. The gate dielectric layer 108 may be any well-known gate dielectric layer material. In an embodiment of the present invention, the gate dielectric layer 108 may be a silicon dioxide ($SiO_2$), silicon oxynitride ($SiO_xN_y$) or a silicon nitride ($Si_3N_4$) dielectric layer. In an embodiment of the present invention, the gate dielectric layer 108 may be a silicon oxynitride film formed to a thickness of between 5-20 Å. In an embodiment of the present invention, gate dielectric layer 108 may be a high K gate dielectric layer, such as a metal oxide dielectric, such as but not limited to tantalum pentaoxide ($Ta_2O_5$), and titanium oxide ($TiO_2$). The gate dielectric layer 108 may be other types of high K dielectric, such as but not limited to PZT, or may be a non-high K dielectric.

The tri-gate transistor 100 may have a gate electrode 110. The gate electrode 110 may be formed on and around gate dielectric layer 108 as shown in FIG. 1a. The gate electrode 110 may have a pair of laterally opposite sidewalls that extend away from the DLC layer 104. The sidewalls may be separated by a distance which defines the gate length (Lg) of the transistor 100. In an embodiment of the present invention the laterally opposite sidewalls of the gate electrode 110 may run in a direction perpendicular to the laterally opposite sidewalls of semiconductor body 106 (such that the laterally opposite sidewalls of the semiconductor body 106 extend in a direction substantially normal to the plane of FIG. 1a, and the laterally opposite sidewalls of the gate electrode 110 extend in a direction substantially parallel to the plane of the FIG. 1a).

Gate electrode 110 can be formed of any suitable gate electrode material. In an embodiment of the present invention to gate electrode 110 comprises polycrystalline silicon doped to a concentration density between $1\times10^{19}$ atoms/$cm^3$-$1\times10^{20}$ atoms/$cm^3$. In an embodiment of the present invention the gate electrode can be a metal gate electrode, such as but not limited to, tungsten, tantalum, titanium, and their nitrides. In an embodiment of the present invention the gate electrode is formed from a material having a mid-gap work function between 4.6-4.8 eV. It is to be appreciated, the gate electrode 110 need not necessarily be a single material and can be a composite stack of thin films, such as but not limited to a polycrystalline silicon/metal electrode or a metal/polycrystalline silicon electrode, or may comprise other materials/material combinations.

As shown in FIG. 1b, the tri-gate transistor 100 may have a source region 122 and a drain region 124. Source region 122 and drain region 124 may be formed in semiconductor body 106 on opposite sides of gate electrode 110. The source region 122 and the drain region 124 may be formed of the same conductivity type such as N-type or P-type conductivity. In an embodiment of the present invention source region 122 and drain region 124 may have a doping concentration of between $1\times10^{19}$, and $1\times10^{21}$ atoms/$cm^3$. Source region 122 and drain region 124 can be formed of uniform concentration or can include subregions of different concentrations or doping profiles such as tip regions (e.g., source/drain extensions). In an embodiment of the present invention when transistor 100 is a symmetrical transistor, source region 122 and drain region 124 may have the same doping concentration and profile. In an embodiment of the present invention when tri-gate transistor 100 is formed as an asymmetric transistor then the doping concentration and profile of the source region 122 and the drain region 124 may vary in order to obtain a particular electrical characteristic.

The portion of semiconductor body 106 located between source region 122 and drain region 124, may define the channel region of transistor 100. The channel region may also be defined as the area of the semiconductor body 106 surrounded by the gate electrode 110. At times however, the source and drain regions 122, 124 may extend slightly beneath the gate electrode through, for example, diffusion to define a channel region slightly smaller than the gate electrode length (Lg). In an embodiment of the present invention channel region may be intrinsic or undoped monocrystalline silicon. In an embodiment of the present invention, channel region may be doped monocrystalline silicon. When channel region is doped it may be doped to a conductivity level of between $1\times10^{16}$ to $1\times10^{19}$ atoms/$cm^3$. In an embodiment of the present invention, when the channel region is doped it may be doped to the opposite conductivity type of the source region 122 and the drain region 124. For example, when the source and drain regions 122, 124 are N-type conductivity the channel region would be doped to p type conductivity. Similarly, when the source and drain regions 122, 124 are P type conductivity the channel region would be N-type conductivity. In this manner a tri-gate transistor 100 can be formed into either a NMOS transistor or a PMOS transistor respectively. Channel region can be uniformly doped or can be doped non-uniformly or with differing concentrations to provide particular electrical and performance characteristics. For example, channel regions can include well-known "halo" regions, if desired.

By providing a gate dielectric 108 and a gate electrode 110 which surrounds the semiconductor body 106 on three sides, the tri-gate transistor 100 may be characterized in having three channels and three gates, one (g1) which extends between the source and drain regions on a first side of the silicon body 106 (such as the left side in FIG. 1a), a second (g2) which extends between the source and drain regions on the top surface of the silicon body 106, and a third (g3) which extends between the source and drain regions on the other side of the silicon body 106 (such as the right side in FIG. 1a). The gate "width" (Gw) of transistor 100 is the sum of the widths of the three channel regions. That is, the gate width of transistor 100 is equal to the height of silicon body 106 at a first sidewall, plus the width of silicon body of 106 at the top surface, plus the height of silicon body 106 at the opposite sidewall. Larger "width" transistors can be obtained by using multiple devices coupled together (e.g., multiple silicon bodies 106 surrounded by a single gate electrode 110).

Because the channel region is surrounded on three sides by gate electrode 110 and gate dielectric 108, transistor 100 can be operated in a fully depleted manner wherein when transistor 100 is turned "on" the channel region fully depletes thereby providing the advantageous electrical characteristics and performance of a fully depleted transistor. The tri-gate transistor 100 can be fabricated with very steep sub-threshold slope of less than 80 mV/decade, and less than about 60 mV/decade, or other values, even when fabricated with semiconductor body 106 thicknesses of less than 30 nm.

Figure 2:
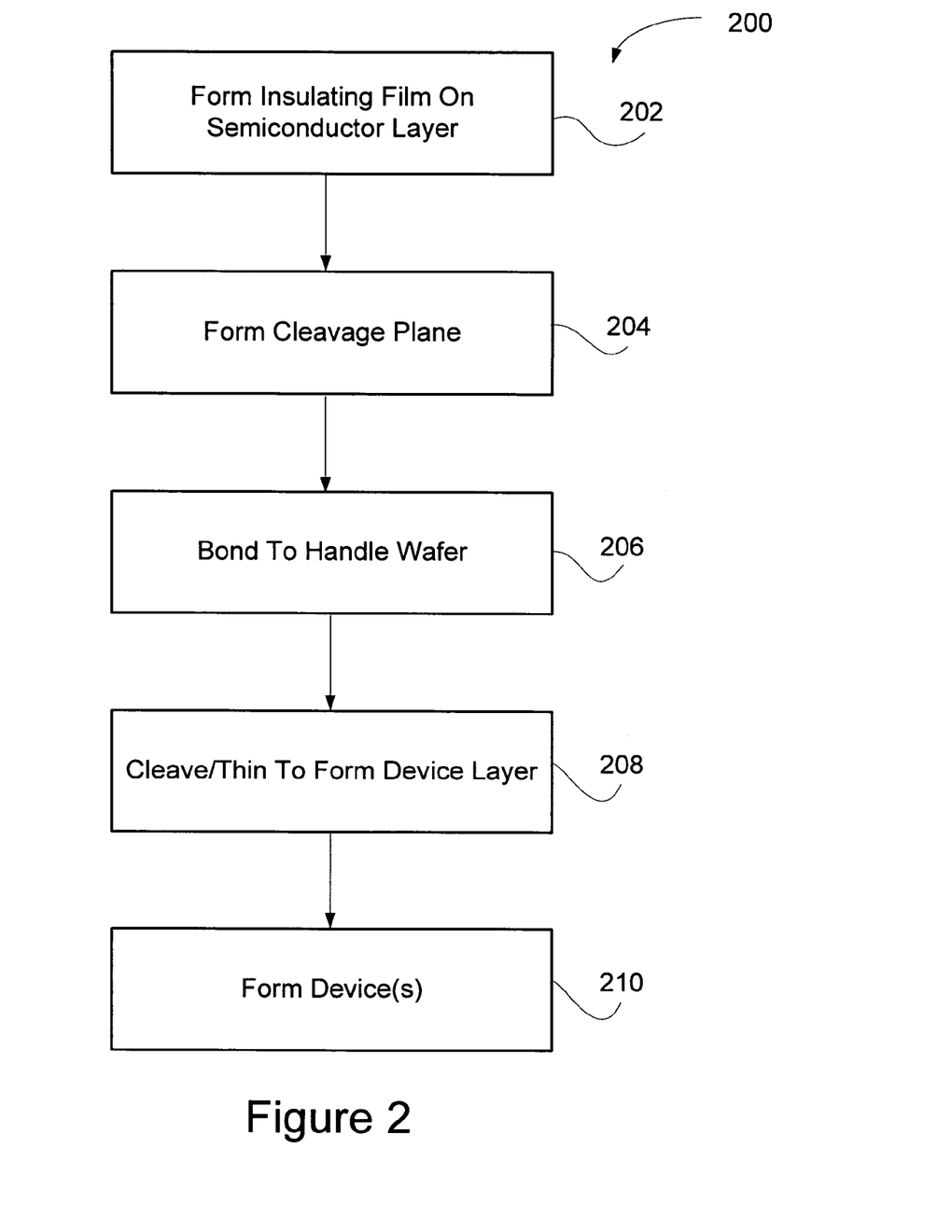
FIG. 2 is a flow chart illustrating how an insulator layer, such as a DLC layer, on a substrate may be fabricated and a device may be fabricated on the insulator layer.

FIG. 2 is a flow chart 200 illustrating how an insulator layer 104, such as a DLC layer 104, on a substrate 102 may be fabricated and a device may be fabricated on the insulator layer 104, according to one embodiment of the present invention. An insulating film, which may comprise a DLC layer, may be formed 202 on a substrate. A cleavage plane may then be formed 204 in the substrate. The substrate and insulating film may be bonded 206 to a handle wafer. The substrate may be cleaved and/or thinned 208 to form a device layer in some embodiments. Device(s) may be formed 210 from the device layer on the insulating layer.

Figure 3A:
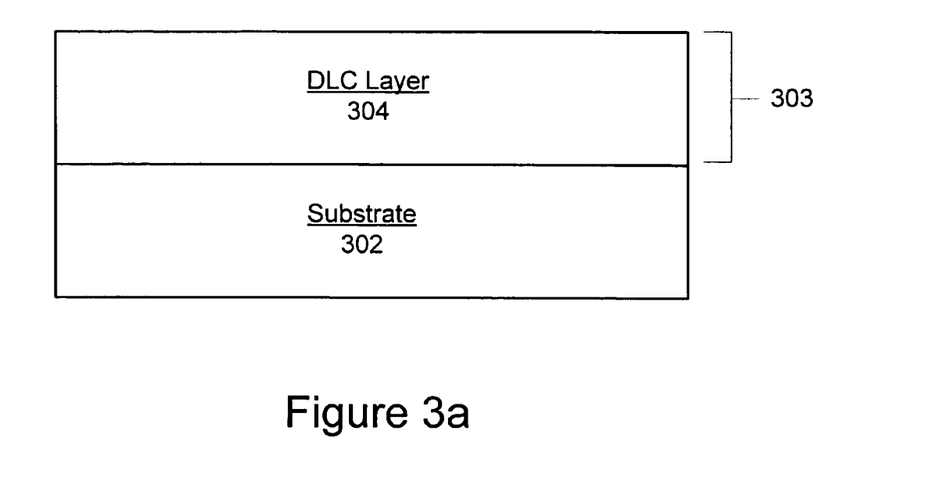

FIGS. 3a through 3f are cross sectional side views that illustrate some various stages in the fabrication described in FIG. 2. FIG. 3a is a cross sectional side view that illustrates the insulating film 304 on the substrate 302. In an embodiment, the substrate 302 may comprise a semiconductor such as monocrystalline silicon, although other materials may be used, as described above with respect to FIGS. 1a and 1b.

The insulating film 304 may comprise a diamond-like carbon (DLC) layer 304 in an embodiment. The DLC layer 304 may be formed by any suitable method, such as ion beam deposition, physical vapor deposition, laser ablation, or other methods. In an embodiment, the DLC layer 304 may be formed by ion beam deposition from a methane precursor at a temperature in a range from about 100 to about 300 degrees Celsius and at a voltage from about 50 to about 100 volts. In an embodiment, the DLC layer 304 may include little hydrogen, and in some embodiments where hydrogen is present after forming the DLC layer 304, that hydrogen may be largely removed by an annealing step or other processes.

In an embodiment, the DLC layer 304 may have a thickness 303. In an embodiment, this thickness 303 may be in a range from about 10 nanometers to about 100 nanometers. In an embodiment, the thickness 303 may be about 20 nanometers or less. In some embodiments, the thickness 303 may be chosen to be as thin as possible while still allowing the DLC layer 304 to function as an insulating layer.

Figure 3B:
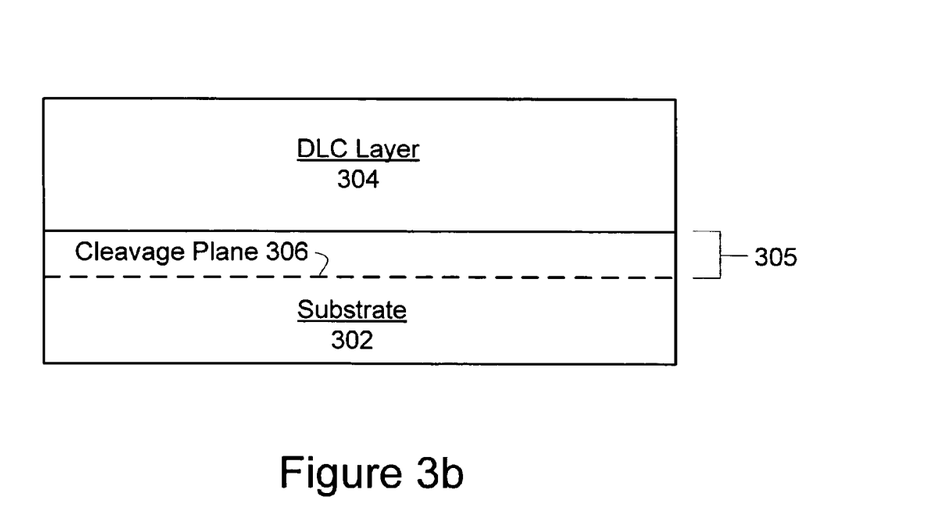

FIG. 3b is a cross sectional side view that illustrates a cleavage plane 306 formed (step 204 of FIG. 2) in the substrate 302. The cleavage plane 306 may be formed by any suitable method. In one embodiment, the cleavage plane 306 may be formed by implantation of hydrogen, which may create voids in the substrate 302. In an embodiment, the cleavage plane 306 may be at a distance 305 from the DLC layer 304 of about 100 nanometers or less.

Figure 3C:
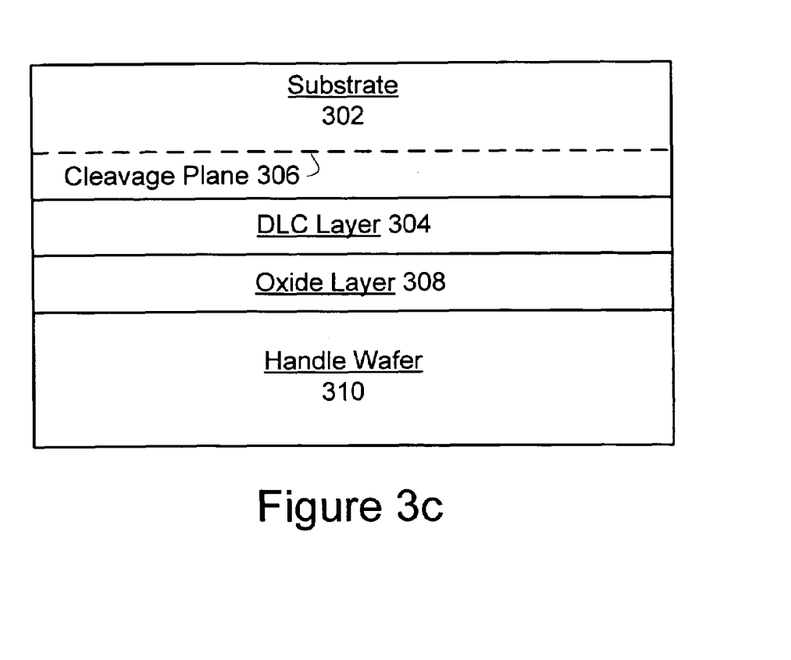

FIG. 3c is a cross sectional side view that illustrates the substrate 302 and DLC layer 304 bonded (step 206 of FIG. 2) to a handle wafer 310. In an embodiment, the handle wafer 310 may comprise single crystal silicon. In other embodiments, the handle wafer 310 may comprise polycrystalline silicon, other semiconductor materials, or other materials.

In an embodiment, there may be an oxide layer 308 or other insulating layer or other type of layer between the DLC layer 304 and the handle layer 310. Some embodiments may lack this oxide layer 308. If present, the oxide layer 308 may comprise silicon dioxide, for example. In some embodiments, the oxide layer 308 may be formed on or added to the DLC layer 304 prior to bonding 206. In other embodiments, the oxide layer 308 may be formed on or added to the handle wafer 310 prior to bonding.

The substrate 302 and DLC layer 304 may be bonded to a handle wafer 310 by any suitable method. In an embodiment that includes an oxide layer 308, the substrate 302 and DLC layer 304 may be bonded to a handle wafer 310 at a temperature between about 500 degrees Celsius and about 800 degrees Celsius, although other temperatures may be used. In embodiment that lacks the oxide layer 308, higher temperatures, such as about 1000 degrees Celsius may be used in the bond process.

Figure 3D:
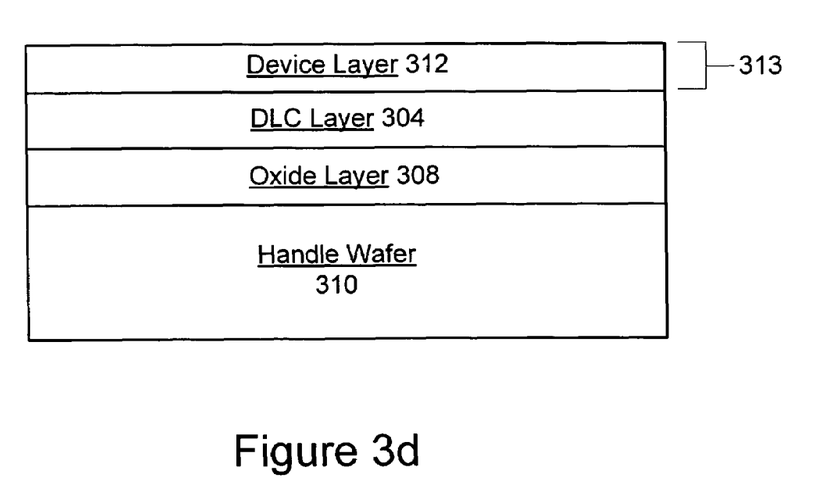

FIG. 3d is a cross sectional side view that illustrates the device layer 312 formed by cleaving/thinning (step 208 of FIG. 2) the substrate 302. The cleaving may be done by any suitable process. After cleaving, the substrate 302 may be further thinned to form the device layer 312. The resulting device layer 312 may have a thickness 313 less than about 30 nanometers in an embodiment. In another embodiment, the thickness 313 may be less than about 20 nanometers, and in yet another embodiment, the thickness may be about 10 nanometers or less. In some embodiments where a tri-gate transistor 100 is to be fabricated from the device layer 312, the thickness 313 may be chosen to be approximately that of the desired height of the body 106 of the transistor 100. At this point, the device layer 312, DLC layer 304, and handle layer 310 may be considered parts of a silicon on insulator (SOI) substrate where DLC is the insulator. Devices may then be fabricated on this SOI substrate.

Figure 3E:
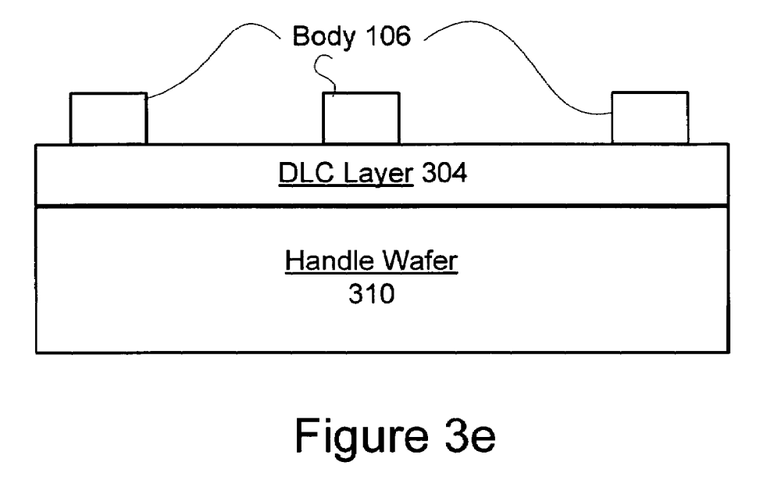
Figure 3F:
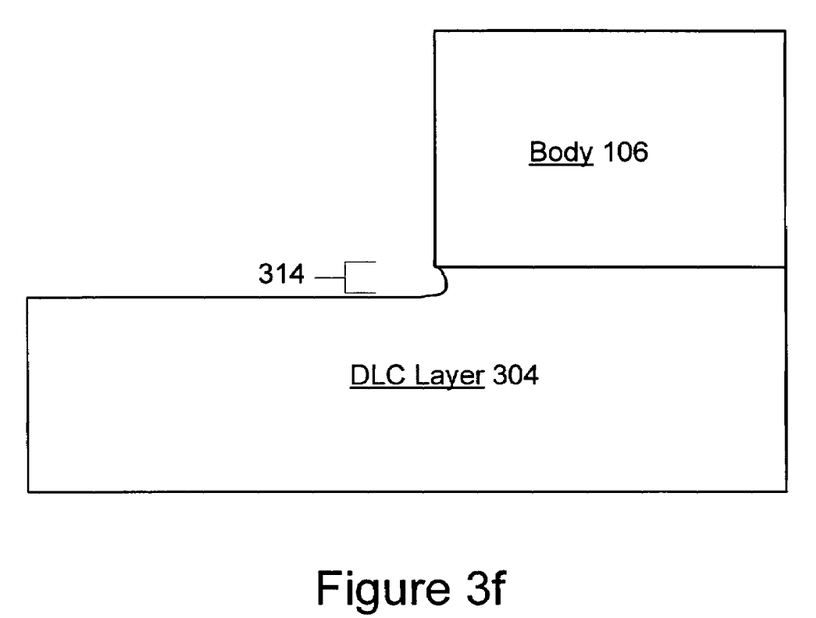

FIGS. 3e and 3f are cross sectional side views illustrating two stages of the formation (step 210 of FIG. 2) of a device that is the tri-gate transistor 100 as described with respect to FIGS. 1a and 1b.

FIG. 3e is a cross sectional side views illustrating the device layer 312 after it has been patterned and portions removed to form multiple bodies 106 of tri-gate transistors 100. Any suitable patterning and etching or other removal methods may be used to form the bodies 106. In an embodiment, removal of portions of the device layer 312 that do not form parts of a body 106 for the transistor 100 may expose regions of the DLC layer 304 beneath the device layer 312. After removal of portions of the device layer 312 to for the bodies 106, the bodies may be considered as the device layer 312, even though much of the former device layer 312 has been removed.

FIG. 3f is a cross sectional side view that illustrates one of the bodies 106 and the DLC layer 304 of FIG. 3e in greater detail. In an embodiment, after performing the etching or other processes to form the body 106, there may be minimal etching of the DLC layer 304, and/or there may be minimal undercutting of the body 106. In an embodiment, the etching or other processes may have removed a thickness of less than about 30 angstroms from the DLC layer 304, although in other embodiments different amounts (or substantially none) of the DLC layer 304 may be removed. In an embodiment, etching or other processes involved in making transistors 100 or other devices may result in the top surface of the DLC layer 304 exposed during formation of the bodies 106 being partially removed, while the top surface of the DLC layer 304 under a center portion of the bodies 106 may remain at its original height. Such a height differential between the top surface of the DLC layer 304 at different locations may be less than about 30 angstroms in some embodiments. Such minimal removal of the DLC layer 304 and/or minimal undercutting of the body 106 may allow formation of a body 106 with extremely small widths. Additional structures may be formed to result in a tri-gate transistor 100 similar to that described with respect to FIGS. 1a and 1b.

Figure 4:
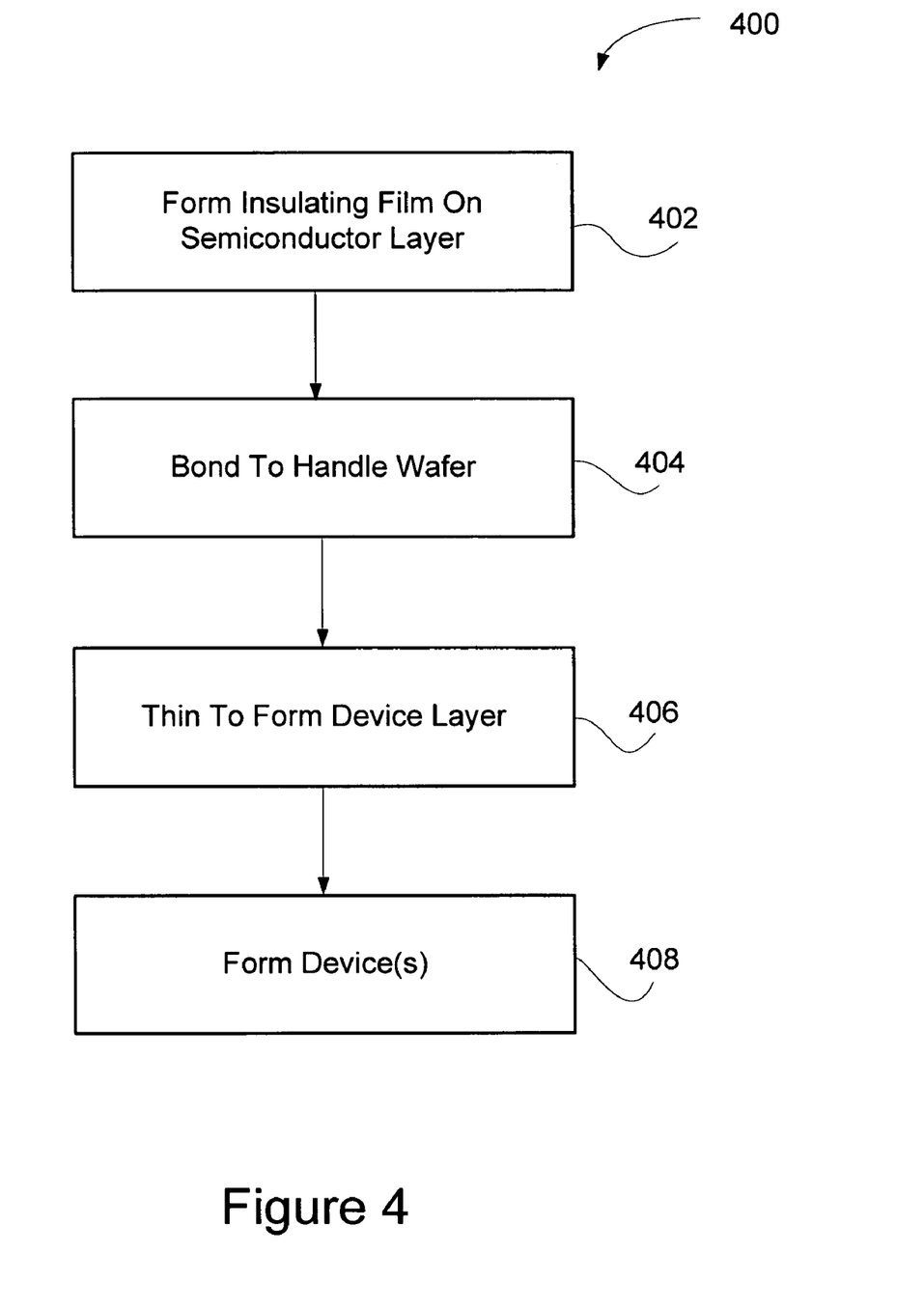
FIG. 4 is a flow chart illustrating how an insulator layer, such as a DLC layer, on a substrate may be fabricated and a device may be fabricated on the insulator layer, according to another embodiment of the present invention.

FIG. 4 is a flow chart 400 illustrating how an insulator layer 104, such as a DLC layer 104, on a substrate 102 may be fabricated and a device may be fabricated on the insulator layer 104, according to another embodiment of the present invention. An insulating film, which may comprise a DLC layer, may be formed 402 on a substrate. The substrate and insulating film may be bonded 404 to a handle wafer. The substrate may be thinned 406 to form a device layer in some embodiments. Device(s) may be formed 408 from the device layer on the insulating layer.

Figure 5A:
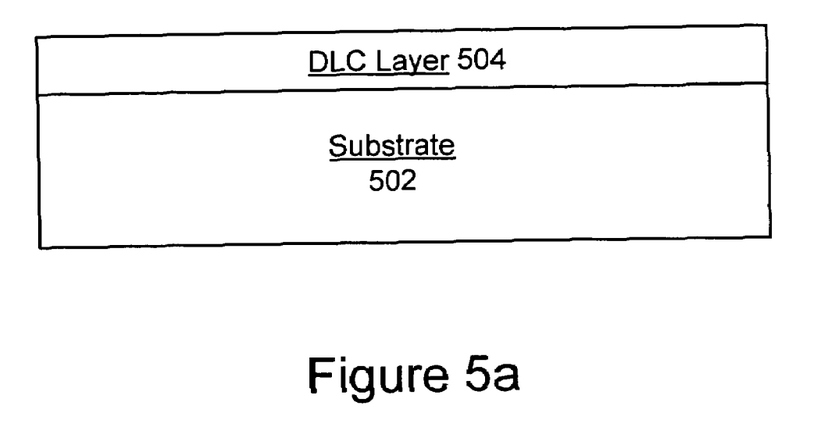

FIGS. 5a through 5d are cross sectional side views that illustrate some various stages in the fabrication described in FIG. 4. FIG. 5a is a cross sectional side view that illustrates the insulating film 504 on the substrate 502. The substrate 502 and insulating film 504 may comprise a semiconductor such as single crystal silicon and DLC, respectively, in an embodiment. In other embodiments, the substrate 502 and insulating film 504 may comprise other materials, as described above with respect to FIG. 3a, and the insulating film 504 (the insulating film may be referred to as a DLC film 504, although in some embodiments the insulating film 504 may comprise materials besides DLC) may be formed (step 402 in FIG. 4) in a similar manner and have a similar thickness as that of FIG. 3a.

Figure 5B:
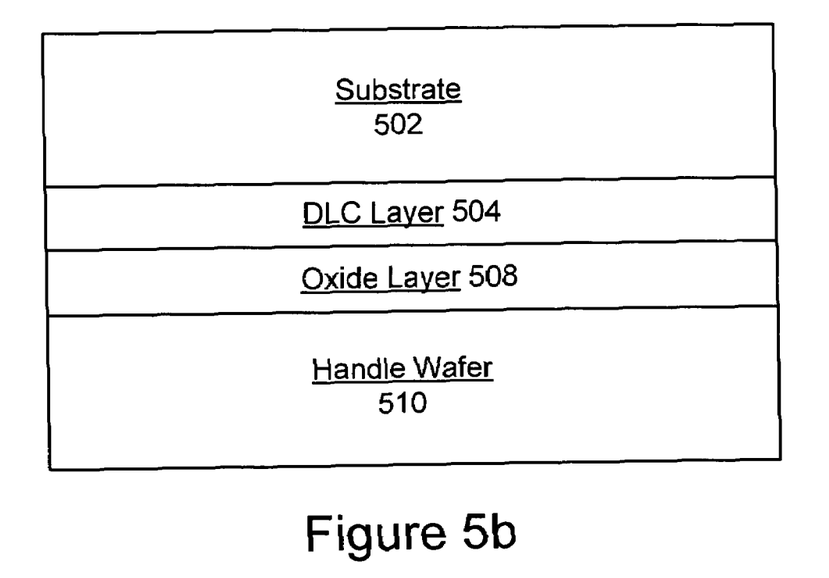

FIG. 5b is a cross sectional side view that illustrates the substrate 502 and DLC layer 504 bonded (step 404 of FIG. 4) to a handle wafer 510. This bonding may be done similarly to that described above with respect to FIGS. 2 and 3. Similarly, the handle wafer 510 may be similar to the handle wafer 310 of FIG. 3, and there may be an oxide layer 508 between the DLC layer 504 and the handle layer 510 (with the oxide layer 508 being on either the DLC layer 504 or the handle layer 510 prior to bonding), or the resulting structure may lack an oxide layer 508.

Figure 5C:
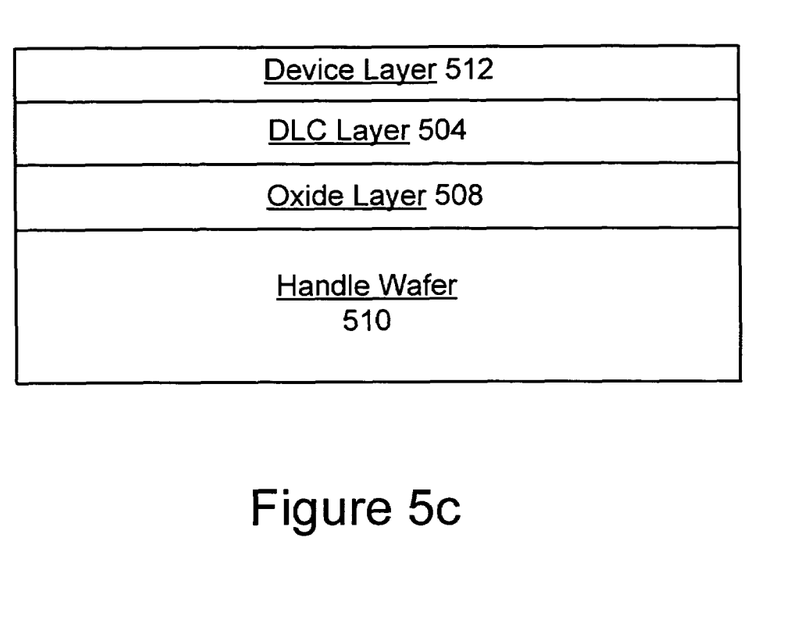

FIG. 5c is a cross sectional side view that illustrates the device layer 512 formed by thinning (step 406 of FIG. 4) the substrate 502. The thinning may be done by any suitable process, such as grinding or etching. The resulting thickness of the device layer 512 may be similar to the thickness 313 described with respect to FIG. 3. At this point, the device layer 512, DLC layer 504, and handle layer 510 may be considered parts of a silicon on insulator (SOI) substrate where DLC is the insulator. Devices may then be fabricated on this SOI substrate.

Figure 5D:
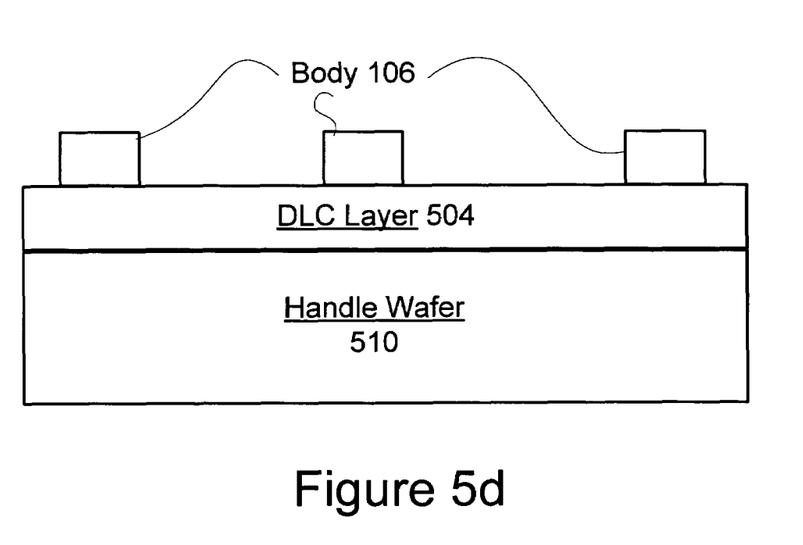

FIG. 5d is a cross sectional side view illustrating a stage of the formation (step 408 of FIG. 4) of a device that is the tri-gate transistor 100 as described with respect to FIGS. 1a and 1b. In FIG. 5d the device layer 512 has been patterned and portions removed to form multiple bodies 106 of tri-gate transistors 100. This may be done similarly to as described with respect to FIG. 3e, and the DLC layer 504 may be similarly minimally affected by the processes used to form the bodies 106. Additional structures may be formed to result in a tri-gate transistor 100 similar to that described with respect to FIGS. 1a and 1b.

Figure 6:
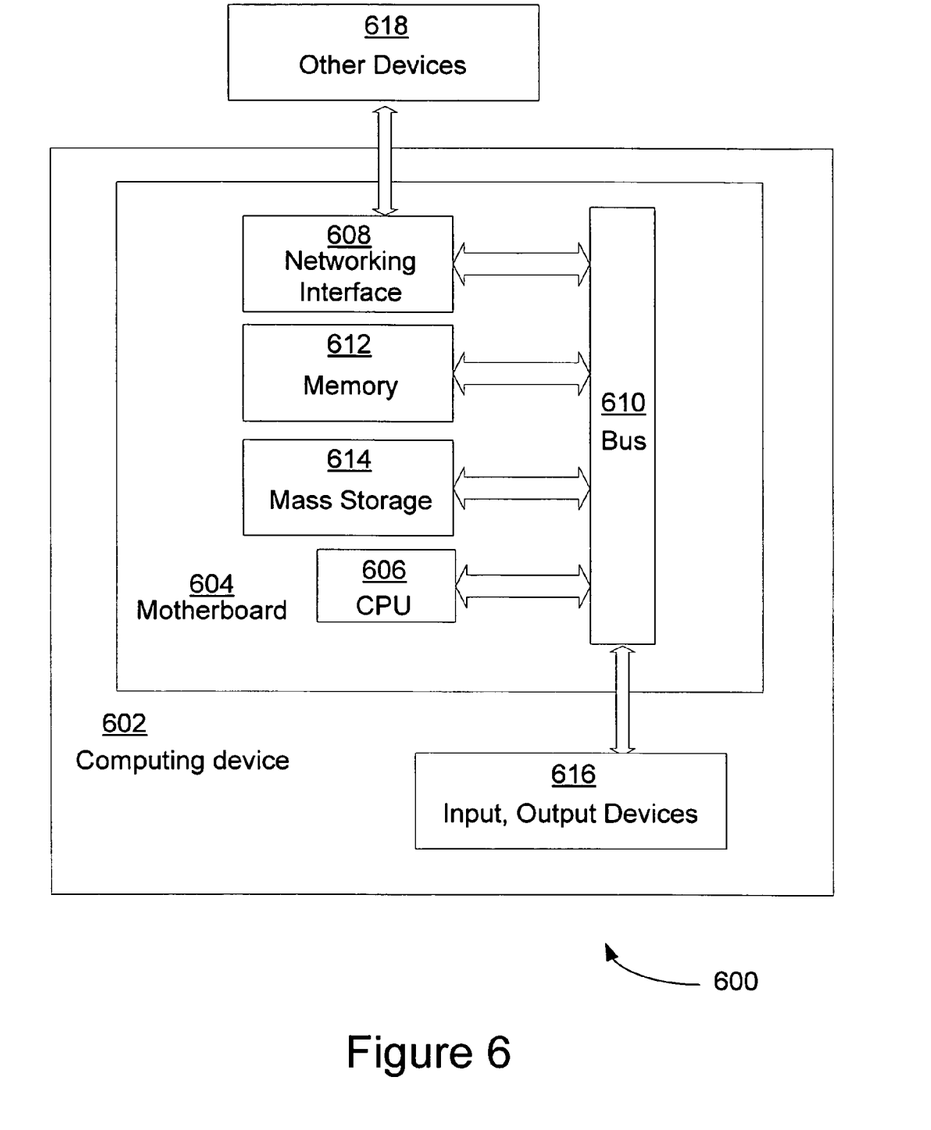
FIG. 6 illustrates a system in accordance with one embodiment of the present invention.

FIG. 6 illustrates a system 600 in accordance with one embodiment of the present invention. One or more devices formed from a DLC layer or other layer on a substrate may be included in the system 600 of FIG. 6. As illustrated, for the embodiment, system 600 includes a computing device 602 for processing data. Computing device 602 may include a motherboard 604. Coupled to or part of the motherboard 604 may be in particular a processor 606, and a networking interface 608 coupled to a bus 610. A chipset may form part or all of the bus 610. The processor 606, chipset, and/or other parts of the system 600 may include one or more transistors 100, such as tri-gate transistors 100 formed on a DLC layer 104.

Depending on the applications, system 600 may include other components, including but not limited to volatile and non-volatile memory 612, a graphics processor (integrated with the motherboard 604 or connected to the motherboard as a separate removable component such as an AGP or PCI-E graphics processor), a digital signal processor, a crypto processor, mass storage 614 (such as hard disk, compact disk (CD), digital versatile disk (DVD) and so forth), input and/or output devices 616, and so forth.

In various embodiments, system 600 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Any of one or more of the components 606, 614, etc. in FIG. 6 may include one or more devices, such as a tri-gate transistor 100, formed on a DLC layer 104 as described herein. For example, the transistor 100 may be part of the CPU 606, motherboard 604, graphics processor, digital signal processor, or other devices.

In an embodiment, a method according to the description above for making a transistor may comprise: forming a substrate with a semiconductor device layer on a diamond-like carbon layer, the diamond-like carbon layer being on a semiconductor substrate; and removing a portion of the device layer to form a transistor body with a top surface and laterally opposite sidewalls. In an embodiment of the method, forming the substrate may comprise: forming the diamond-like carbon layer on a thick semiconductor layer; bonding the diamond-like carbon layer to the semiconductor substrate; and removing a portion of the thick semiconductor layer to form the semiconductor device layer. In another embodiment of the method, the method may further comprise forming a tri-gate transistor, wherein forming the tri-gate transistor comprises: forming a gate dielectric on the top surface and on the laterally opposite sidewalls of the transistor body; and forming a gate electrode on the gate dielectric. In another embodiment of the method, removing a portion of the device layer to form a transistor body may comprise exposing at least a portion of the diamond-like carbon layer.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A device, comprising:
   a semiconductor substrate;
   a layer of diamond-like carbon on the substrate;
   a transistor on the layer of diamond-like carbon, wherein the transistor comprises a body having a top surface and laterally opposite sidewalls,
   a gate dielectric formed on the top surface and on the laterally opposite sidewalls, and a gate electrode formed on the gate dielectric; and
   wherein the body is on the diamond-like carbon and a top surface of the layer of diamond-like carbon under a center of the body is less than about 30 angstroms above a top surface of the layer of diamond-like carbon adjacent to, but not under the body.

2. The device of claim 1, wherein the layer of diamond-like carbon has a thickness less than 100 nanometers.

3. The device of claim 1, wherein the substrate comprises silicon.

4. The device of claim 1, wherein the body has a width of about 10 nanometers or less.

5. The device of claim 1, further comprising an oxide layer between the substrate and the layer of diamond-like carbon.

6. A device, comprising:
   a semiconductor substrate;
   a layer of insulating material with a thermal conductivity in a range from about 0.5 W/cmK to about 1.0 W/cmK;
   an oxide layer between the substrate and the layer of insulating material; and
   a transistor on the layer of insulating material.

7. The device of claim 6, wherein the layer of insulating material comprises diamond-like carbon.

8. The device of claim 6, wherein the layer of insulating material has a thickness less than 100 nanometers.

9. The device of claim 6, wherein the transistor is a tri-gate transistor comprising:
   a body having a top surface and laterally opposite sidewalls;
   a gate dielectric formed on the top surface and on the laterally opposite sidewalls; and
   a gate electrode formed on the gate dielectric.

10. The device of claim 9, wherein the body is on the layer of insulating material and a top surface of the layer of insulating material under a center portion of the body is less than 30 angstroms above a top surface of the layer of insulating material adjacent to, but not under the body.

11. The device of claim 9, wherein the body has a width of about 10 nanometers or less.

12. A device, comprising:
    a semiconductor substrate;
    an insulating layer on the substrate, the insulating layer having a top surface;
    a transistor on the insulating layer, the transistor comprising:
       a body on the insulating layer, the body having a top surface and laterally opposite sidewalls;
       a gate dielectric formed on the top surface and on the laterally opposite sidewalls; and
       a gate electrode formed on the gate dielectric; and
    wherein the top surface of the insulating layer under a center portion of the body is less than about 30 angstroms above the top surface of the insulating layer adjacent to the body, but not under the body or another transistor body.

13. The device of claim 12, wherein the body has a width of about 10 nanometers or less.

14. The device of claim 12, wherein the insulating layer comprises diamond-like carbon.

15. The device of claim 14, wherein the insulating layer has a thickness less than 100 nanometers.

16. The device of claim 14, wherein the insulating layer has a thickness less than about 20 nanometers.

17. A product, comprising:
    a semiconductor substrate;
    a layer of diamond-like carbon on the substrate;
    an oxide layer between the substrate and the layer of diamond-like carbon;
    a semiconductor device layer on the layer of diamond-like carbon;
    a transistor, wherein the transistor comprises a body having a top surface and laterally opposite sidewalls, the body being a portion of the semiconductor device layer;
    a gate dielectric formed on the top surface and on the laterally opposite sidewalls; and
    a gate electrode formed on the gate dielectric.

18. The product of claim 17, wherein the body has a width of about 10 nanometers or less.

* * * * *